US008234412B2

(12) United States Patent
Pascual et al.

(10) Patent No.: US 8,234,412 B2
(45) Date of Patent: Jul. 31, 2012

(54) METHOD AND SYSTEM FOR TRANSMITTING COMPACTED TEXT DATA

(75) Inventors: Revelino M. Pascual, New York, NY (US); Margo T. Mao, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 2549 days.

(21) Appl. No.: 09/950,035

(22) Filed: Sep. 10, 2001

(65) Prior Publication Data

US 2003/0051056 A1    Mar. 13, 2003

(51) Int. Cl.
    G06F 15/16    (2006.01)
(52) U.S. Cl. ............................ 709/247; 709/206
(58) Field of Classification Search .............. 709/218, 709/246–247, 203, 206–207; 707/10, 200, 707/513, 541; 715/513, 530; 706/45
    See application file for complete search history.

(56) References Cited

U.S. PATENT DOCUMENTS

| 5,930,512 | A | 7/1999 | Boden et al. ............... 395/710 |
| 6,012,098 | A | 1/2000 | Bayeh et al. ............... 709/246 |
| 6,055,569 | A | 4/2000 | O'Brien et al. ............. 709/223 |
| 6,141,666 | A | 10/2000 | Tobin ....................... 707/513 |
| 6,182,029 | B1 | 1/2001 | Friedman ..................... 704/9 |
| 6,249,844 | B1 | 6/2001 | Schloss et al. ............. 711/122 |
| 6,349,202 | B1 * | 2/2002 | Odamura ................... 455/412.1 |
| 6,560,639 | B1 * | 5/2003 | Dan et al. .................. 709/218 |
| 6,635,088 | B1 * | 10/2003 | Hind et al. ................. 715/513 |
| 6,643,668 | B2 * | 11/2003 | Sluiman .................... 707/200 |
| 6,711,557 | B1 * | 3/2004 | Palaniappan ................. 706/45 |
| 6,721,747 | B2 * | 4/2004 | Lipkin ........................ 707/10 |
| 7,025,209 | B2 * | 4/2006 | Hawkins ..................... 209/217 |
| 7,162,035 | B1 * | 1/2007 | Durst et al. .................. 380/54 |
| RE39,589 | E * | 4/2007 | Raivisto ..................... 455/410 |
| 2001/0037345 | A1 * | 11/2001 | Kiernan et al. .............. 707/513 |
| 2002/0013795 | A1 * | 1/2002 | Dresevie et al. ............. 707/541 |

OTHER PUBLICATIONS

Stephens, L. M.; "Consensus Ontologies. Reconciling the Semantics of Web Pages and Agents", Internet Computing, IEEE, vol. 5, Issue 5, Sep./Oct. 2001, pp. 92-95.*
Author: Obermann, D., IBM Technical Disclosure Bulletin, "Design to Enable Locate Tagging for the Database Manager", vol. 37, No. 1, pp. 145-153, Jan. 1994.
Author: Elo, S. and Milton, J.; "Virtual URLs for Browsing and Searching Large Information Spaces", RD vol. 41, No. 413, article 41392, Sep. 1998.

(Continued)

*Primary Examiner* — Christopher Biagini
(74) *Attorney, Agent, or Firm* — Cantor Colburn LLP; Derek Jennings

(57) ABSTRACT

An exemplary embodiment of the present invention is a method for transmitting compacted text data. A standard form data message is translated into a compacted form data message. The translating includes first locating a long tag in the standard form data message. A short tag in a sender translation table that corresponds to the long tag is identified in a sender translation table. The compacted form data message is created by substituting the short tag for the long tag in the standard form data message. The compacted form data message is transmitted to a receiver system. Then, a flag is set in response to determining if the sender translation table needs to be transmitted to the receiver system and the flag is transmitted to the receiver system. The sender translation table is transmitted to the receiver system in response to the determination of whether the translation table needs to be transmitted. Additional embodiments include a system and storage medium for transmitting compacted text data.

38 Claims, 3 Drawing Sheets

OTHER PUBLICATIONS

"An Automated Approach for Retrieving Hierarchical Data from HTML Tables"; Authors: Seung-Jin Lim and Yiu-Kai Ng; Computer Science Department Brigham Young University, Provo, UT, USA; Proceedings of the Eighth International Conference on Information Knowledge Management. CIKM' 99; pp. 466-474, Published: New York, NY, USA, 1999.

Proceedings Second International Workshop on Advanced Issues of E-Commerce and Web-Based Information Systems, WECWIS 2000, A Generic Load/Extract Utility for Data Transfer Between XML Documents and Relational Databases; Authors: R. Bourret, C. Bornhovd, A. Buchmann; Edited by: Philip S. Yu; Published by: IEEE Computer Society; pp. 134-143; 2000.

* cited by examiner sage. The translating includes first locating a long tag in the standard form data message. A short tag in a sender translation table that corresponds to the long tag is identified in a sender translation table. The compacted form data message is created by substituting the short tag for the long tag in the standard form data message. The compacted form data message is transmitted to a receiver system. Then, a flag is set in response to determining if the sender translation table needs
METHOD AND SYSTEM FOR TRANSMITTING COMPACTED TEXT DATA

FIELD OF THE INVENTION

The present invention relates generally to transmitting compacted text data. More particularly, the present invention relates to a method and system for transmitting compacted text data by substituting short tag names for standard tag names.

BACKGROUND OF THE INVENTION

Internet use has become widespread and as a result, many corporations utilize the Internet to conduct at least some portion of their business transactions. Extensible Markup Language (XML), a subset of Standard Generalized Markup Language (SGML), was designed for use in documents being sent across the Internet. XML allows a computer user to define a structured method of creating text data to be shared by several locations. XML is an example of a formatted text language and is a standard way of sharing structured data that allows the integration of data from multiple sources. It is a text based tag language and the meaning of data is described in the tags which can be accessed by a program. XML tags are placed at the front and at the end of every data element that occurs in a message. The XML tags are typically written so that they are understandable by a system user. This makes it possible for a system user to look at the name of the tag and to determine the type of data associated with the tag. A receiving application must parse, or validate, each character to find the ending delimiter of every data element received. In some cases the same tags may occur hundreds or thousands of times. The use of long form names for the tags increases the amount of time required to process the data and it increases the transmission time.

For example, a corporation may allow a business partner to place orders electronically. Each order placed by the business partner could contain hundreds of part numbers. If the tag for part number is "GlobalPartNumber" then this tag will occur twice for every part number ordered, once at the start of the part number data and once to signal the end of the part number data. An XML message formatted using this tag to identify "9704" as a part number would be as follows: "<GlobalPartNumber>9704</GlobalPartNumber>." In general, the tag names are defined so that a system user could look at the tag name "GlobalPartNumber" and figure out that the data that follows is a part number. However, the time spent parsing and transmitting the electronic order is increased by this lengthy tag name. Another problem is that the cost of storing the electronic order may be increased because of the extra storage required to store the multiple instances of the tag "GlobalPartNumber."

SUMMARY OF THE INVENTION

An exemplary embodiment of the present invention is a method for transmitting compacted text data. A standard form data message is translated into a compacted form data message. The translating includes first locating a long tag in the standard form data message. A short tag in a sender translation table that corresponds to the long tag is identified in a sender translation table. The compacted form data message is created by substituting the short tag for the long tag in the standard form data message. The compacted form data message is transmitted to a receiver system. Then, a flag is set in response to determining if the sender translation table needs to be transmitted to the receiver system and the flag is transmitted to the receiver system. The sender translation table is transmitted to the receiver system in response to the determination of whether the translation table needs to be transmitted. Additional embodiments include a system and storage medium for transmitting compacted text data.

DETAILED DESCRIPTION OF THE INVENTION

Figure 1:
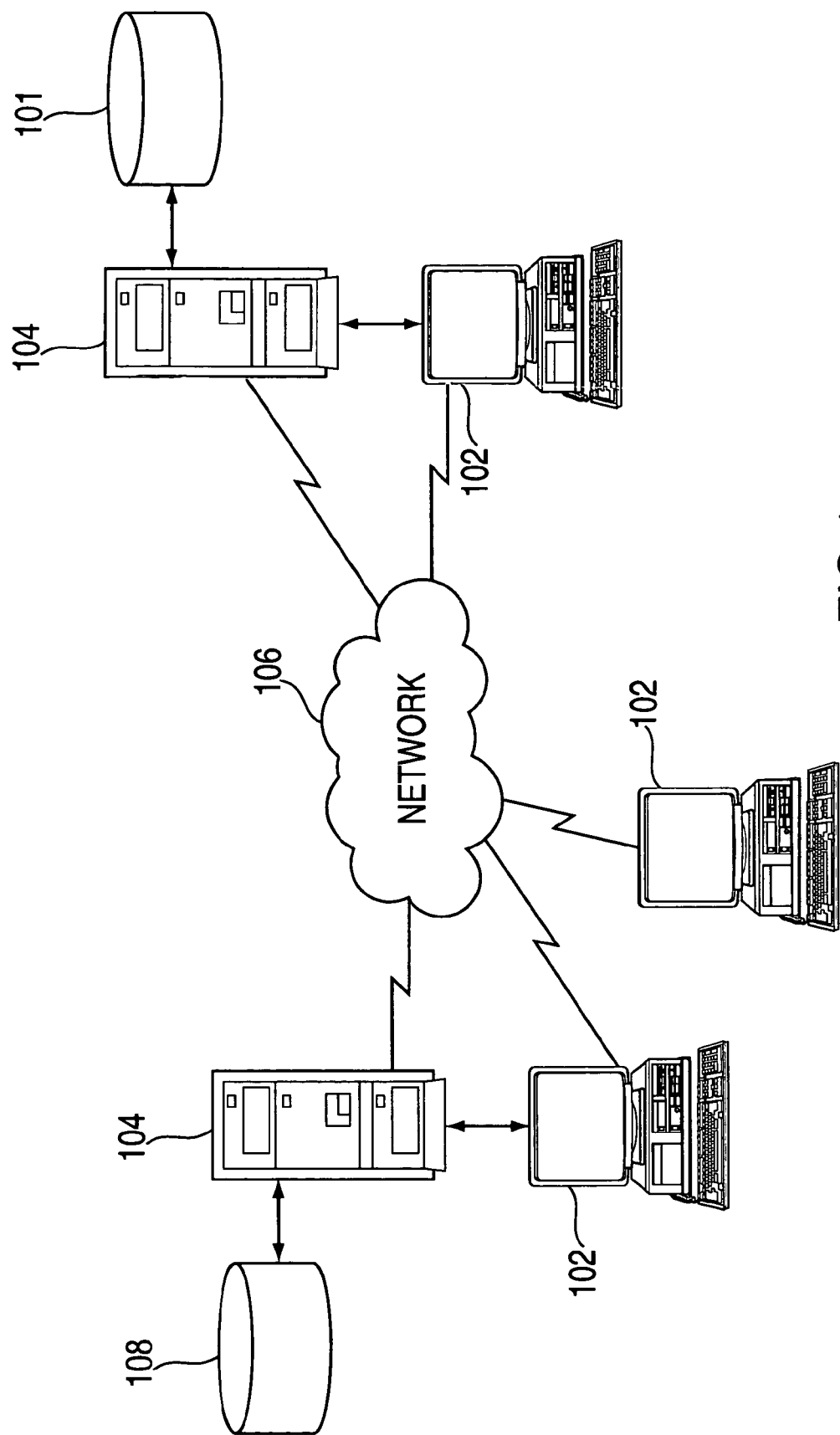
FIG. 1 is a block diagram of an exemplary system for transmitting compacted text data.

An exemplary embodiment of the present invention compacts XML messages by substituting a fixed length alphanumeric alias or short tag for the standard XML tags (also referred to as long tags). In an exemplary embodiment, a translation table used to make the substitution is transmitted from a sending system to a receiving system. Also transmitted is the compacted XML message. Once the receiving system receives the compacted message along with the translation table it can recreate the original standard form XML message. XML is used for example purposes only, the invention could be applied to other formatted text languages (e.g. hypertext markup language and SGML). FIG. 1 is a block diagram of an exemplary system for transmitting compacted text data. The system of FIG. 1 includes user systems 102 through which a user application could make a request to an application on a host system 104 to translate between a standard form data message and a compacted form data message and then to transmit the compacted message to a receiver system. Additionally, these requests could come from a computer application running on a host system 104. In a preferred embodiment, the host systems 104 execute programs that translate between standard and compacted form data messages. The user systems 102 can be directly connected to a host system 104 or they could be coupled to a host system 104 via a network 106. Each user system 102 may be implemented using a general-purpose computer executing a computer program for carrying out the processes described herein. The user systems 102 may be personal computers or host attached terminals. If the user systems 102 are personal computers, the processing described herein may be shared by user system 102 and host system 104 by providing an applet to the user system 102.

The network 106 may be any type of known network including a local area network (LAN), a wide area network (WAN), or a global network (e.g., Internet). A user system 102 may be coupled to a host system 104 through multiple networks (e.g., intranet and Internet) so that not all user systems 102 are coupled to a particular host system 104 through the same network. One or more of the user systems 102 and host systems 104 may be connected to network 106 in a wireless fashion and network 106 may be a wireless network. In a preferred embodiment, network 106 is the Internet and each user system 102 executes a user interface application to directly connect to a host system 104. In another embodiment, a user system 102 may execute a web browser to contact a host system 104 through the network 106. Alternatively, a user system 102 may be implemented using a device programmed primarily for accessing network 106 such as WebTV.

A host system 104 may be implemented using a server operating in response to a computer program stored in a storage medium accessible by the server. The host system 104 may operate as a network server (often referred to as a web server) to communicate with the user systems 102. Host system 104 handles sending and receiving information to and from user systems 102 and can perform associated tasks. Host system 104 may also include a firewall to prevent unauthorized access to the host system 104 and enforce any limitations on authorized access. For instance, an administrator may have access to the entire system and have authority to modify portions of the system. The firewall may be implemented using conventional hardware and/or software as is known in the art.

The host systems 104 also operate as application servers. A host system 104 executes one or more computer programs to translate between compact and standard form data messages and to transmit data to a receiving system. Processing may be shared by the user system 102 and a host system 104 by providing an application (e.g., java applet) to the user system 102. Alternatively, the user system can include a stand-alone software application for performing a portion of the processing described herein. It is understood that separate servers may be used to implement the network server functions and the applications server functions. Alternatively, the network server, firewall and the applications server can be implemented by a single server executing computer programs to perform the requisite functions.

Storage device 108 may be implemented using a variety of devices for storing electronic information such as a file transfer protocol (FTP) server. It is understood that storage device 108 may be implemented using memory contained in a host system 104 or may be a separate physical device. Storage device 108 contains a variety of information including the translation table and the data messages. Storage device 108 may also contain information concerning the transmission of the translation table and the compacted form data message (e.g. a user identifier, date and time of submission). The host system 104 may also operate as a database server and coordinate access to application data including data stored on storage device 108. In an exemplary embodiment, a copy of a translation table is stored on the storage devices 108 associated with the host system 104 at both the sending and receiving locations.

Figure 2:
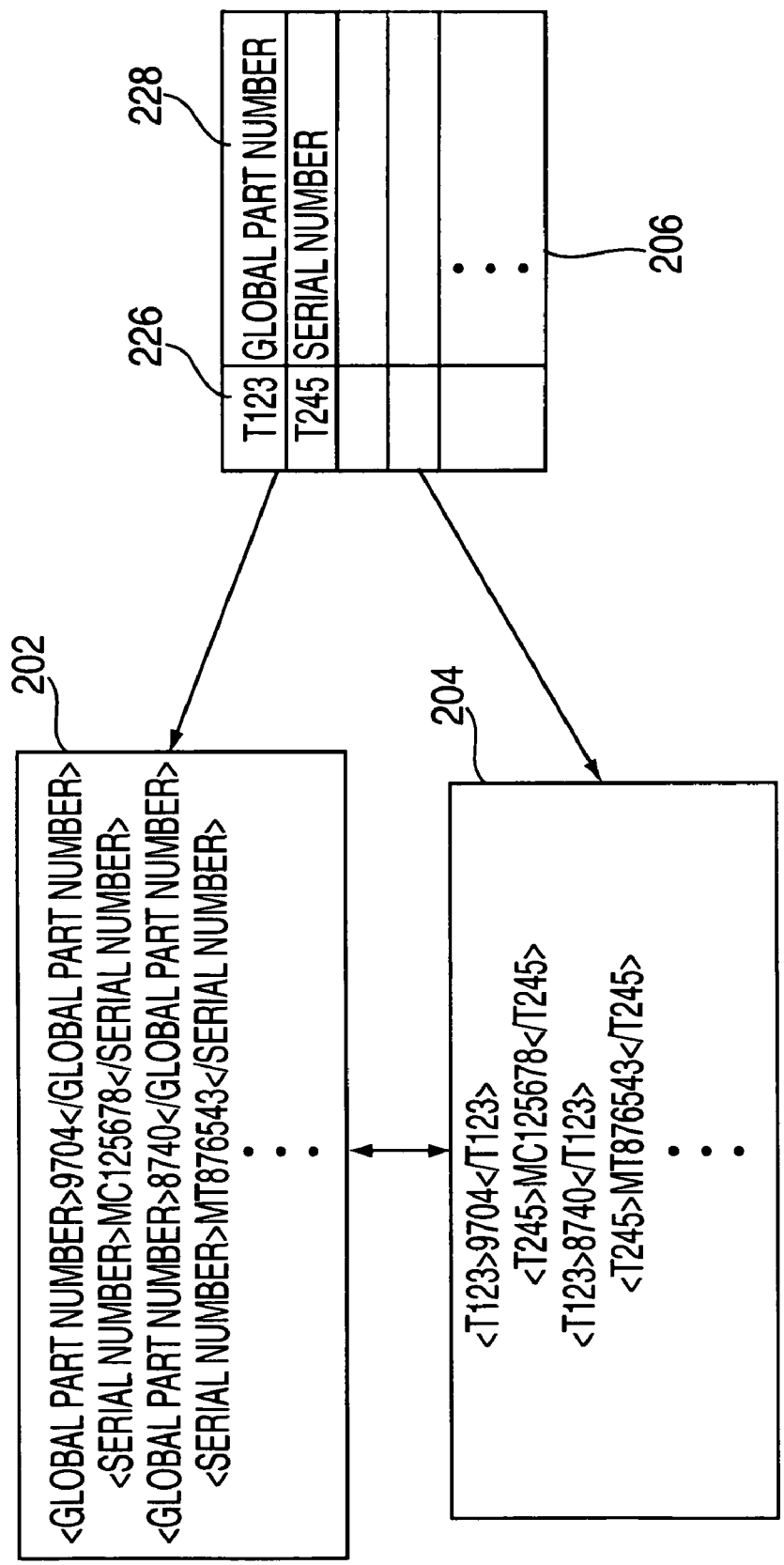
FIG. 2 is an exemplary layout of a translation table to be used for transmitting compacted text data along with examples of a standard form text data message and a compacted form data message.

FIG. 2 is an exemplary layout of a translation table to be used for translating between standard and compacted form data messages. Also depicted, using XML as an example, is an exemplary standard form data message and compacted form data message. In an exemplary embodiment, the translation table 206 is stored on a storage device 108 connected to a host system 104 and the table includes two columns, one containing the short tag 226 and the other containing the long tag 228. The short tag can be assigned by first creating a translation table 206 that contains a row for each of the long tags contained in the standard form message. In the example depicted in FIG. 2 the long tag 228 "GlobalPartNumber" is replaced with the short tag 226 "T123." Similarly, the long tag 228 "SerialNumber" is replaced with the short tag 226 "T245." FIG. 2 also depicts a portion of data containing standard XML tags 202. The standard form XML text 202 contains a line that references a GlobalPartNumber of "9704" with a SerialNumber of "MC125678". Using the translation table 206, these lines get translated into the compacted form 204. The translation table 206 can be used for translating from standard form into compacted form and to translate from compacted form into standard form. In an exemplary embodiment, the formatted text data is stored on storage device 108 either as a flat file or as a database entry.

Figure 3:
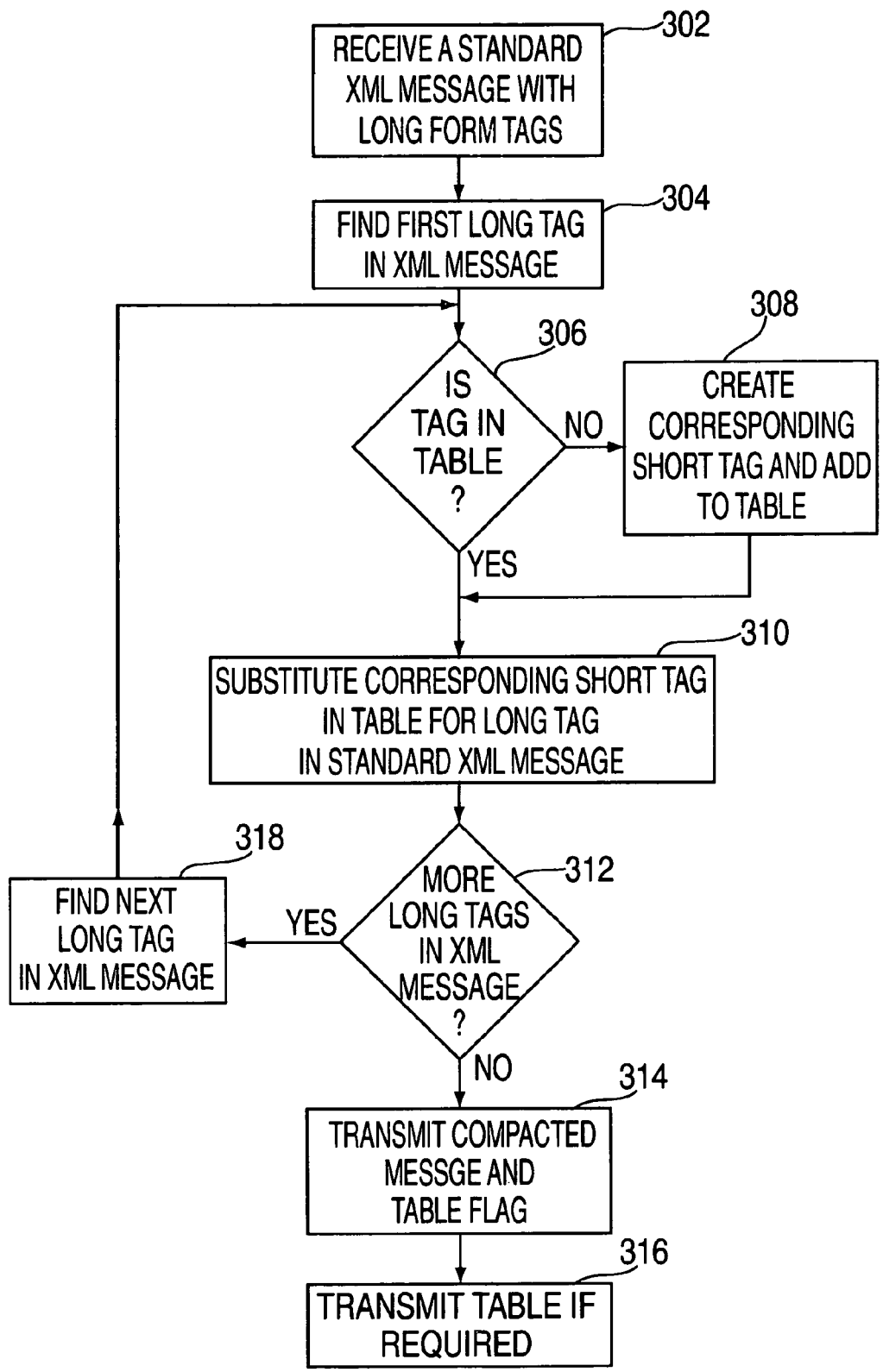
FIG. 3 is a flowchart of an exemplary process for creating and transmitting compacted text data.

FIG. 3 is a flowchart of an exemplary process for creating and transmitting compacted text data messages. The process starts at step 302, with the receipt of a standard XML message containing long tags. The program locates the first long tag at step 304. Then, at step 306, the long tag is looked up in the translation table. If the long tag is not contained in the translation table then step 308 is performed and the user is prompted to create a short tag for the long tag and to add the short tag to the translation table. Then, step 310 is performed to substitute the short tag in the translation table that corresponds to the long tag into the standard XML message in place of the long tag. The XML message is checked to see if it contains more standard tags in step 312. If the XML message contains more standard or long tags, then step 318 is performed to locate the next long tag in the XML message. Then, the loop starting at 306 is performed and the loop continues until all standard or long tags have been replaced with short tags. The result is a compacted XML message stored on a storage device 108. When the XML message contains no more standard tags, step 314 is performed and the compacted form data message is transmitted to the receiving system along with a flag that indicates if the translation table has also been transmitted.

Finally, at step 316 the translation table is transmitted to a receiving system, if required. In an exemplary embodiment, the entire translation table would be required to be transmitted only if tag names have been added or changed since the last time the receiver system received a translation table. In another embodiment, only the changed elements would need to be transmitted to the receiving system. In either case, the flag sent with the compacted form data message would be set to indicate if additional information is being transmitted. In an exemplary embodiment, the flag would be equal to yes if the entire translation table was being transmitted, equal to no if the translation table was not being transmitted and equal to partial if only some of the rows in the translation table were being transmitted. In an exemplary embodiment, the partial translation table transmission could be implemented by adding a column to the translation table to indicate if a tag has been updated. Then, only the rows containing an indicator that the tag has been updated would be sent to the receiver system.

In an exemplary embodiment, the receiving host system 104 would store a copy of the translation table and would contain software to translate the compacted XML messages into standard XML tag messages. In another embodiment, the receiving location could request a new copy of the translation table if it does not find an entry for a short tag in the compacted message. In addition, the receiving system could leave the data in compacted form and translate it into standard form only if necessary for a particular computer program. Similarly, the transmitting location could use computer programs to create text data directly into the compacted form. In this exemplary embodiment, the data would only be translated into standard form if it was required for a particular computer program.

Another embodiment of the present invention would utilize the translation table to translate text data messages between different languages (e.g. French, English, German). This would be useful for corporations that conduct business in various countries. The translation table would contain additional alternate language columns, each column representing long tags in various languages. Using XML as an example, the long XML tags would all be compacted to the same fixed length short tag but would be expanded to a standard XML tag based on the language requested by the computer program or computer user. In this way, the ability to read and understand the data content of the formatted text data would be enhanced along with still being able to take advantage of the savings associated with using compacted text data.

As described above, the user system 102 and the host system 104 can share the processing. For example, the user system 102 may include a software application that allows the user system to create compacted text data without assistance from the host system 104. The user system 102 would then contact the host system 104 to transmit the compacted data message to a receiving host system 104. Alternatively, the host system 104 may provide an application to the user system 102 (e.g., an applet) once the user system 102 contacts the host system 104. Accordingly, processing can be shared by the two systems.

The present invention provides many improvements over sending a standard form text message. Assigning a fixed length (e.g. two or four characters) alphanumeric alias (or short tag) to a long tag (an XML tag for example) will speed up the parsing of XML documents and reduce data transmission time. XML, for example, requires long descriptive terms that have to be placed at the start and at the end of every data element or section in a document. By substituting aliases for the tags, parsing will be predictable as opposed to scanning every character in an XML tag to find the end delimiter. Fast response time is important because formatted text data, such as XML, is widely used in electronic business solutions and is beginning to be used to deliver data to a variety of platforms including hand held devices.

As described above, the present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore, it is intended that the invention not be limited to the particular embodiments for carrying out this invention, but that the invention will include all embodiments falling within the scope of the appended claims.

What is claimed is:

1. A method for transmitting compacted data, said method comprising;
    translating from a standard form data message into a compacted firm data message, said translating comprising:
    locating a long tag in said standard form data message;
    identifying a short tag in a sender translation table, said short tag corresponding to said long tag in said sender translation table; and
    creating said compacted form data message by substituting said short tag for said long tag in said standard form data message;
    setting a flag in response to determining that said sender translation table should be transmitted to said receiver system, wherein said sender translation table should be transmitted if said sender translation table has been undated since a previous time that said sender translation table was sent to said receiver system;
    transmitting said compacted form data message with said flag to a receiver system; and
    transmitting said sender translation table to said receiver system in response to said flag being set.

2. The method of claim 1 wherein said flag is set by a computer program.

3. The method of claim 1 wherein said flag is set by a system user.

4. The method of claim 1 wherein said sender translation table includes a short tag column and a long tag column.

5. The method of claim 4 wherein said sender translation table further includes an alternate language tag column.

6. The method of claim 4 wherein said sender translation table further includes an updated data column.

7. The method of claim 6 wherein a row of said sender translation table is transmitted to said receiver system in response to said row containing a yes in said updated data column and if said flag is set to partial.

8. The method of claim 1 wherein said sender translation table is updated by a computer program.

9. The method of claim 1 wherein said sender translation table is updated by a system user.

10. The method of claim 1 wherein said standard form data message includes XML tags.

11. The method of claim 1 further comprising:
    receiving, said compacted form data message and said flag at said receiver system; and
    receiving said sender translation table into a receiver translation table at said receiver system if said flag is set.

12. A system for transmitting compacted data, said system comprising:
    a computer system comprising a processor and memory in communication with a network, said computer system implementing a process comprising:
    translating from a standard form data message into a compacted form data message, said translating comprising:
    locating a long tag in said standard form data message;
    identifying a short tag in a sender translation table, said short tag corresponding to said long tag in said sender translation table; and
    creating said compacted form data message by substituting said short tag for said long tag in said standard form data message;
    setting a flag in response to determining that said sender translation table should be transmitted to said receiver system, wherein said sender translation table should be transmitted if said sender translation table has been updated since a previous time that said sender translation table was sent to said receiver system;

transmitting said compacted form data message with said flag to a receiver system; and transmitting said sender translation table to said receiver system in response to said flag being set.

13. The system of claim 12 wherein said flag is set by a computer program.

14. The system of claim 12 wherein said flag is set by a system user.

15. The system of claim 12 wherein said sender translation table includes a short tag column and a long tag column.

16. The system of claim 15 wherein said sender translation table further includes an alternate language tag column.

17. The system of claim 15 wherein said sender translation table further includes an update data column.

18. The system of claim 17 wherein a row of said sender translation table is transmitted to said receiver system in response to said row containing a yes in said updated data column and if said flag is set to partial.

19. The system of claim 12 wherein said sender translation table is updated by a computer program.

20. The system of claim 12 wherein said sender translation table is updated by a system user.

21. The system of claim 12 wherein said standard form data message includes XML tags.

22. The system of claim 12 wherein said process further comprises:

receiving said compacted form data message and said flag at said receiver system; and receiving said sender translation table into a receiver translation table at said receiver system if said flag is set.

23. The system of claim 12 wherein said network is an intranet.

24. The system of claim 12 wherein said network is the Internet.

25. A non-transitory storage medium encoded with machine-readable computer program code for transmitting compacted data, the storage medium storing instructions for causing a host system to implement a method comprising:

translating from a standard form data message into a compacted form data message, said translating comprising:

locating a long tag in said standard form data message;

identifying a short tag in a sender translation table, said short tag corresponding to said long tag in said sender translation table; and creating said compacted form data message by substituting said short tag for said long tag in said standard form data message;

setting a flag in response to determining that said sender translation table should be transmitted to said receiver system, wherein said sender translation table should be transmitted if said sender translation table has been updated since a previous time that said sender translation table was sent to said receiver system;

transmitting said compacted form data message with said flag to a receiver system; and transmitting said sender translation table to said receiver system in response to said flag being set.

26. The storage medium of claim 25 wherein said flag is set by a computer program.

27. The storage medium of claim 25 wherein said flag is set by a system user.

28. The storage medium of claim 25 wherein said sender translation table includes a short tag column and a long tag column.

29. The storage medium of claim 28 wherein said sender translation table further includes an alternate at tag column.

30. The storage medium of claim 28 wherein said sender translation table further includes an updated data column.

31. The storage medium of claim 30 wherein a row of said sender translation table is transmitted to said receiver system in response to said row containing a yes in said updated data column and if said flag is set to partial.

32. The storage medium of claim 25 wherein said sender translation table is updated by a computer program.

33. The storage medium of claim 25 wherein said sender translation table is updated by a system user.

34. The storage medium of claim 25 wherein said standard form data message includes XML tags.

35. The storage medium of claim 25 further comprising instructions for causing the host system to implement:

receiving said compacted form data message and said flag at said receiver system; and receiving said sender translation table into a receiver translation table at said receiver system if said flag is set.

36. A method for transmitting compacted data, said method comprising:

translating from a standard form data message into a compacted form data message Including:

locating a long tag in said standard form data message;

identifying a short tag in a sender translation table, said short tag corresponding to said lone tag in said sender translation table; and creating said compacted form data message by substituting said short tag for said long tag in said standard form data message;

setting a flag in response to determining that said sender translation table should be transmitted to said receiver system;

transmitting said compacted form data message with said flag to a receiver system;

transmitting said sender translation table to said receiver system in response to said flag being set;

receiving said compacted form data message and said flag at said receiver system;

receiving said sender translation table into a receiver translation table at said receiver system if said flag is set; and translating said compacted form data message into said standard form data message at said receiver system including:

locating a short tag in said compacted form data message;

identifying a long tag in said receiver translation table, said long tag corresponding to said short tag in said receiver translation table; and creating the standard form data message by substituting said long tag for said short tag in said compacted form data message.

37. A system for transmitting compacted data, said system comprising;

a sender system and a receiver system, the sender system comprising a processor and memory and including instructions for:

translating from a standard form data message into a compacted form data message including:

locating a long tag in said standard form data message;

identifying a short tag in a sender translation table, said short tag corresponding to said long tag in said sender translation table; and creating said compacted form data message by substituting said short tag for said long tag in said standard form data message;

setting a flag in response to determining that said sender translation table should be transmitted to said receiver system;

transmitting said compacted form data message with said flag to a receiver system;

transmitting said sender translation table to said receiver system in response to said flag being set; and the receiver system including instructions for:

receiving said compacted form data message and said flag at said receiver system;

receiving said sender translation table into a receiver translation table at said receiver system if said flag is set; and translating said compacted form data message into said standard form data message including:

locating a short tag in said compacted form data message;

identifying a long tag in said receiver translation table, said long tag corresponding to said short tag in said receiver translation table; and creating the standard form data message by substituting said long tag for said short tag in said compacted form data message.

38. A non-transitory storage medium encoded with machine-readable computer program code for transmitting compacted data, the storage medium storing computer instructions for:

translating from, a standard form data message into a compacted form data message including:

locating a long tag in said standard form data message;

identifying a short tag in a sender translation table, said short tag corresponding to said long tag in said sender translation table; and creating said compacted form data message by substituting said short tag for said long tag in said standard form data message;

setting a flag in response to determining that said sender translation table should be transmitted to said receiver system;

transmitting said compacted form data message with said flag to a receiver system;

transmitting said sender translation table to said receiver system in response to said flag being set;

receiving said compacted form data message and said flag at said receiver system;

receiving said sender translation table into a receiver translation table at said receiver system if said flag is set; and translating said compacted form data message into said standard form data message at said receiver system including:

locating a short tag in said compacted form data message;

identifying a long tag in said receiver translation table, said long tag corresponding to said short tag in said receiver translation table; and creating the standard form data message by substituting said long tag for said short tag in said compacted form data message.

\* \* \* \* \*